(12) United States Patent
Cha et al.

(10) Patent No.: US 10,209,320 B2
(45) Date of Patent: Feb. 19, 2019

(54) METHOD FOR ESTIMATING SOC-OCV PROFILE BY DEGRADATION OF SECONDARY BATTERY

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/323,601

(22) PCT Filed: Sep. 30, 2015

(86) PCT No.: PCT/KR2015/010321
§ 371 (c)(1),
(2) Date: Jan. 3, 2017

(87) PCT Pub. No.: WO2016/064104
PCT Pub. Date: Apr. 28, 2016

(65) Prior Publication Data
US 2017/0146610 A1   May 25, 2017

(30) Foreign Application Priority Data
Oct. 24, 2014  (KR) .................. 10-2014-0145531

(51) Int. Cl.
*G01R 31/36*   (2006.01)
*H01M 10/48*   (2006.01)
(Continued)

(52) U.S. Cl.
CPC ......... *G01R 31/3679* (2013.01); *G01R 31/36* (2013.01); *G01R 31/3651* (2013.01);
(Continued)

(58) Field of Classification Search
CPC ............................................. G01R 31/3679
(Continued)

(56) References Cited

U.S. PATENT DOCUMENTS

2012/0065824 A1* 3/2012 Takahashi ............ G01R 31/361
701/22
2013/0317771 A1* 11/2013 Laskowsky ........ G01R 31/3675
702/63
(Continued)

FOREIGN PATENT DOCUMENTS

JP          2014-59206 A       4/2014
KR   10-2011-0084633 A       7/2011
KR   10-2013-0136800 A      12/2013

OTHER PUBLICATIONS

International Search Report, issued in PCT/KR2015/010321 (PCT/ISA/210), dated Feb. 2, 2016.

*Primary Examiner* — Ricky Ngon
(74) *Attorney, Agent, or Firm* — Birch, Stewart, Kolasch & Birch, LLP

(57) ABSTRACT

A method for estimating an SOC-OCV profile by degradation of a secondary battery according to an embodiment of the present disclosure includes individually obtaining an SOC-OCV profile (a first profile) of a cathode of the secondary battery and an SOC-OCV profile (a second profile) of an anode of the secondary battery using a half cell; obtaining a new SOC-OCV profile (a third profile) of the cathode by reflecting a level of degradation (a %) by use of the secondary battery to modify the SOC-OCV profile of the cathode, but setting only an SOC range to be narrow in proportion to the level of degradation while maintaining an OCV range of the cathode as it is; obtaining a new SOC-OCV profile (a fourth profile) of the anode by migrating the SOC-OCV profile of the anode in a horizontal direction taking into account the level of degradation by use of the secondary battery; and obtaining a new SOC-OCV profile (a fifth profile) by determining a subtraction of an OCV value by the SOC-OCV profile of the anode from an OCV value (Continued)

by the SOC-OCV profile of the cathode as an OCV value of the secondary battery.

6 Claims, 6 Drawing Sheets

(51) Int. Cl.
*H01M 4/505* (2010.01)
*H01M 4/525* (2010.01)
*H01M 4/587* (2010.01)

(52) U.S. Cl.
CPC ........... *H01M 4/505* (2013.01); *H01M 4/525* (2013.01); *H01M 4/587* (2013.01); *H01M 10/48* (2013.01)

(58) Field of Classification Search
USPC .......................................................... 702/63
See application file for complete search history.

(56) References Cited

U.S. PATENT DOCUMENTS

| | | | |
|---|---|---|---|
| 2014/0132222 A1 | 5/2014 | Joe et al. | |
| 2015/0147614 A1* | 5/2015 | Wang | G01R 31/3624 429/93 |
| 2016/0103185 A1* | 4/2016 | Chang | G01R 31/362 324/429 |

* cited by examiner

METHOD FOR ESTIMATING SOC-OCV PROFILE BY DEGRADATION OF SECONDARY BATTERY

TECHNICAL FIELD

The present application claims priority to Korean Patent Application No. 10-2014-0145531 filed on Oct. 24, 2014, the disclosure of which is incorporated herein by reference.

The present disclosure relates to a method for estimating an SOC-OCV profile by degradation of a secondary battery, and more particularly, to a method for estimating the SOC-OCV profile capable of obtaining the SOC-OCV profile of the secondary battery by estimating the SOC-OCV of each of a cathode and an anode in different methods.

BACKGROUND ART

Secondary batteries, which generate electrical energy by way of electrochemical oxidation and reduction reaction, are used over a wide range of applications. For example, the batteries are being used in increasing range of areas including portable apparatuses such as portable phone, laptop computer, digital camera, video camera, tablet computer, power tool, gearing tool and so on that can be carried around in a user's hand; various electrically-driven power apparatuses such as electric bicycle, electric motorcycle, electric vehicle, hybrid vehicle, electric ship, electric airplane, and so on; a power storage apparatus being used to store power generated through new renewable energy or surplus power generated; and an uninterrupted power supply apparatus and so on for stably supplying power to various information communication apparatuses including server computers and base stations for communication.

The batteries includes three basic elements which are: an anode containing a material that undergoes oxidation and releases electrons during discharging; a cathode containing a material that undergoes reduction and accepts electrons during discharging; and an electrolyte that allows migration of ions between the anode and the cathode. The batteries can be categorized into primary batteries which are not reusable once they are discharged, and secondary batteries which have at least partially reversible electrochemical reaction, thus are repetitively chargeable and dischargeable.

Among these, as the secondary batteries, lead-acid battery, nickel-cadmium battery, nickel-zinc battery, nickel-iron battery, silver oxide battery, nickel metal hydride battery, zinc-manganese oxide battery, zinc-bromide battery, metal-air battery, lithium secondary battery, and so on, are known. Among these, the lithium secondary batteries are attracting greatest commercial attentions, in view of their relatively higher energy density, higher battery voltage and longer storage life than other secondary batteries.

Meanwhile, an electronic apparatus where the secondary battery is applied generally has a function of providing information on the remaining usable amount based on a state of charge (SOC) of the secondary battery, and such an SOC of the secondary battery is usually obtained according to a profile of an aspect of change of the SOC caused by a change in an open circuit voltage (OCV).

Such a profile of the aspect of change of SOC-OCV differs not only depending on the type or capacity and so on of a subject secondary battery being applied, but also differs as degradation by use progresses even when the type or capacity and so on of the secondary battery is specified.

In order to predict the SOC with precision using such a profile of an aspect of change of SOC-OCV, it is necessary to measure the OCV of the secondary battery with precision, and since the OCV can be measured with precision in a state where the secondary battery is completely stabilized, it is difficult to quickly measure with precision the OCV that changes constantly as the secondary battery is used.

Therefore, the need arises to study ways to easily predict an SOC-OCV profile after a certain level of degradation has progressed using a profile of an aspect of change of an SOC-OCV pre-measured according to the type or capacity and so on of the secondary battery being applied, that is, a known SOC-OCV profile of a fresh cell.

DISCLOSURE

Technical Problem

The present disclosure is designed to solve the problems of the related art, and therefore the present disclosure is directed to providing a method for easily predicting a new SOC-OCV profile after a certain level of degradation has progressed using an SOC-OCV profile after the certain level of degradation has progressed using a known SOC-OCV profile of a fresh cell.

The other objectives and advantages of the present disclosure can be understood with the following description and more clearly with the embodiments of the present disclosure. Also, it should easily be understood that the other objectives and advantages of the present disclosure can be implemented by the means described in the claims and the combinations thereof.

Technical Solution

A method for estimating an SOC-OCV profile by degradation of a secondary battery according to an embodiment of the present disclosure for solving the aforementioned technical problems includes individually obtaining an SOC-OCV profile (a first profile) of a cathode of the secondary battery and an SOC-OCV profile (a second profile) of an anode of the secondary battery using a half cell; obtaining a new SOC-OCV profile (a third profile) of the cathode by reflecting a level of degradation (a %) by use of the secondary battery to modify the SOC-OCV profile of the cathode, but setting only an SOC range to be narrow in proportion to the level of degradation while maintaining an OCV range of the cathode as it is; obtaining a new SOC-OCV profile (a fourth profile) of the anode by migrating the SOC-OCV profile of the anode in a horizontal direction taking into account the level of degradation by use of the secondary battery; and obtaining a new SOC-OCV profile (a fifth profile) by determining a subtraction of an OCV value by the SOC-OCV profile of the anode from an OCV value by the SOC-OCV profile of the cathode as an OCV value of the secondary battery.

Each of the first profile to the fifth profile may be represented in a form of a function having an SOC value as an X value and the OCV value as a Y value.

In the first profile and the second profile, range of the X (%) may be $0 \leq X \leq 100$, and in the third profile and the fourth profile, range of the X (%) may be $a \leq X \leq 100$.

When the first profile is $Y=F1(X)$, the third profile may be represented as $Y=F1(((100-a)/100) \times X+a)$.

When the second profile is $Y=F2(X)$, the fourth profile may be represented as $Y=F2(X-a)$.

The fifth profile may be represented as $Y=F1(((100-a)/100) \times X+a)-F2(X-a)$ (note, $a \leq X \leq 100$).

The cathode may have an NMC group material applied as its cathode active material, and the anode may have a graphite material applied as its anode active material.

The OCV range of the cathode in the first profile and in the third profile may be the same being 3.36V to 4.3V regardless of the level of degradation.

The OCV range of the anode in the second profile may be represented as 0.10V to 0.23V.

Advantageous Effects

The present disclosure gives the following effects. According to an aspect of the present disclosure, it is possible to quickly and precisely predict an SOC-OCV profile where the progressed level of degradation caused by use of a secondary battery is reflected.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Figure 1:
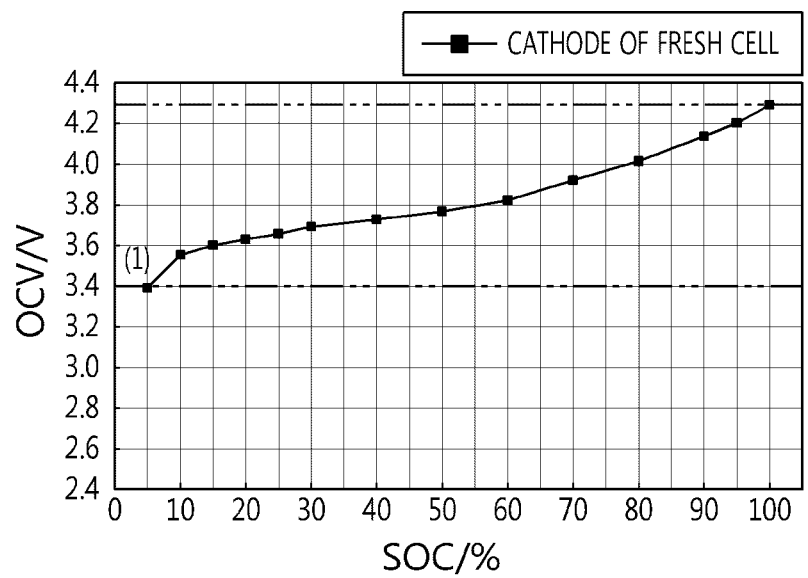
FIG. 1 is a graph illustrating an SOC-OCV profile (profile 1) of a cathode of a secondary battery.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the embodiments disclosed in the present specification and the configurations illustrated in the drawings are merely the most preferred embodiments of the present disclosure, and not all of them represent the technical ideas of the present disclosure, and thus it should be understood that there may be various equivalents and modified examples that could substitute therefor at the time of filing the present application.

The method for estimating an SOC-OCV profile by degradation of a secondary battery according to an embodiment of the present disclosure includes individually obtaining an SOC-OCV profile of each of a cathode and an anode of the secondary battery (S1); obtaining a modified SOC-OCV profile of the cathode and a modified SOC-OCV profile of the anode, respectively, by reflecting a level of degradation of the secondary battery (S2); and obtaining a modified SOC-OCV profile of the secondary battery (full cell) using the modified SOC-OCV profile of each of the cathode and the anode (S3).

Each of the steps constituting the aforementioned method for estimating a SOC-OCV profile will be explained in detail with reference to FIGS. 1 to 6 hereinafter.

First of all, the step S1 will be explained more specifically with reference to FIG. 1 and FIG. 2.

Figure 2:
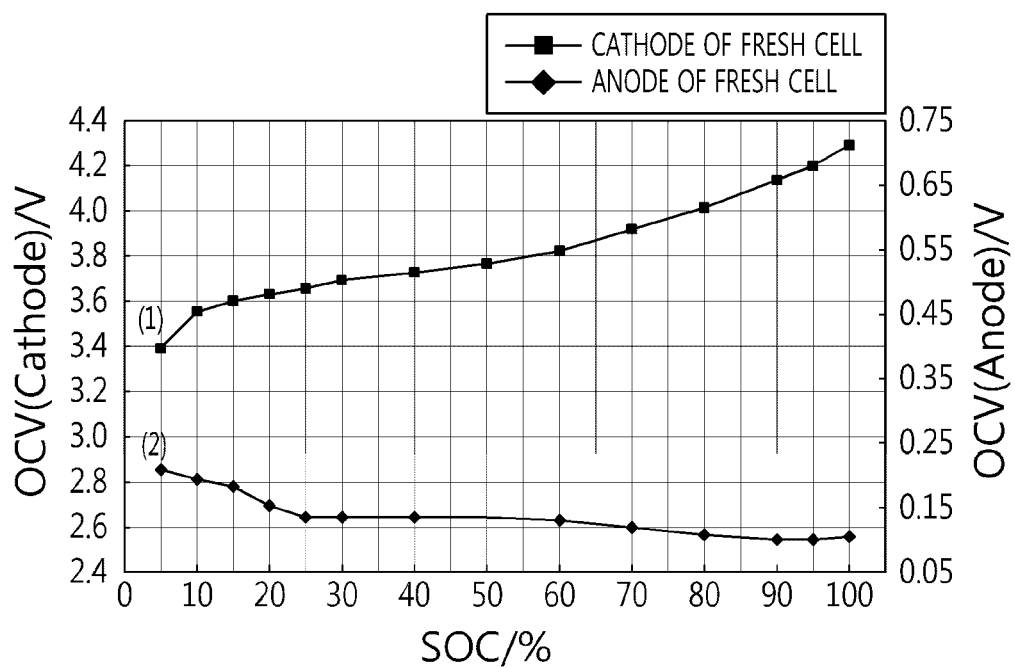
FIG. 2 is a graph illustrating an SOC-OCV profile (profile 2) of an anode of the secondary battery together with profile 1 illustrated in FIG. 1.

FIG. 1 is a graph illustrating an SOC-OCV profile (profile 1) of a cathode of a secondary battery, and FIG. 2 is a graph illustrating an SOC-OCV profile (profile 2) of an anode of the secondary battery together with profile 1 illustrated in FIG. 1.

Referring to FIG. 1 and FIG. 2, the step S1 is a step of individually obtaining the SOC-OCV profile (profile 1 and profile 2) of each of the cathode and the anode of a fresh cell by measuring an open circuit voltage (OCV) of the cathode and the anode caused by a change in a state of charge (SOC) of the secondary battery using a half cell, that is, a cell provided with only one of the cathode and the anode.

Here, as a cathode active material being applied to the cathode, $Li_{1+x}Ni_aCo_bMn_cO_2$ (x≥0; a=b=c=⅓; hereinafter referred to as NMC), that is a lithium transition metal oxide having a layered structure may be used, and as an anode active material being applied to the anode, graphite may be used. Further, in a case where such a lithium transition metal oxide is used as the cathode active material, a lithium metal may be used as a reference electrode for measuring the OCV of the half cell.

However, the NMC and graphite are mere examples of the cathode active material and the anode active material applied to an experiment example for deriving the graph illustrated in FIG. 1 and FIG. 2 of the present disclosure, and there is no limitation thereto, and thus various known types of cathode active materials and anode active materials may be applied.

In fact, in a secondary battery where the NMC is applied as the cathode active material and the graphite is applied as the anode active material, in the case of the cathode, the OCV changed within a range of about 3.37V to 4.28V by change of SOC (%) (refer to FIG. 1), and in the case of the anode, the OCV changed within a range of about 0.1.V to 0.23V (refer to FIG. 2).

Such an SOC-OCV profile is an SOC-OCV profile obtained using a fresh cell where degradation has not progressed yet, and thus hereinafter, the profile of the cathode of the fresh cell will be referred to as profile 1, and the profile of the anode of the fresh cell will be referred to as profile 2.

Next, the step S2 will be explained more specifically with reference to FIGS. 3 to 5.

Figure 3:
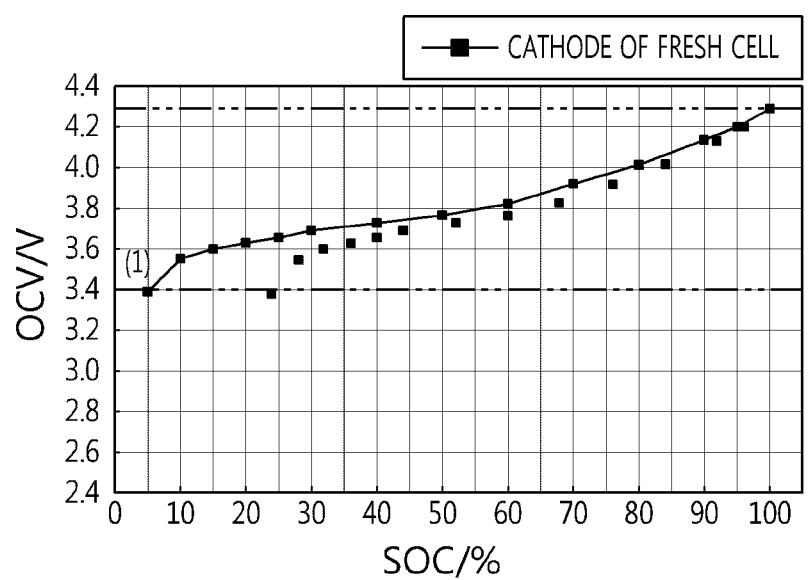
FIG. 3 is a view illustrating a process for modifying profile 1 in order to obtain a new SOC-OCV in a case where degradation by use of the secondary battery has progressed.
Figure 4:
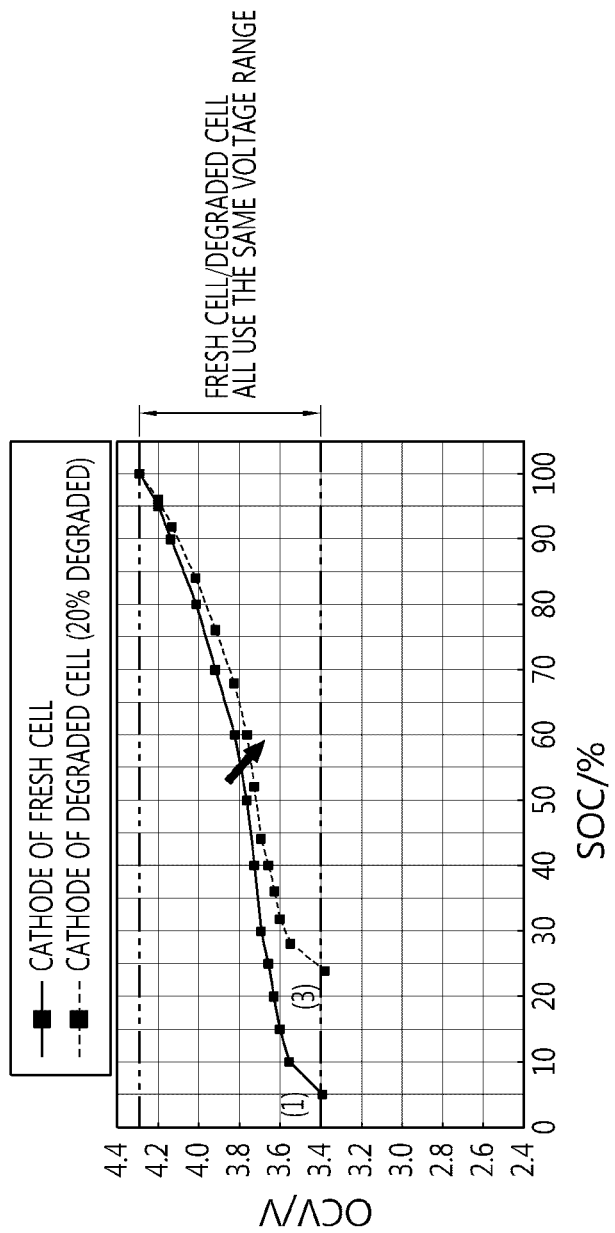
FIG. 4 is a graph illustrating a new SOC-OCV profile (profile 3) of the cathode of the secondary battery obtained by going through the modifying process of FIG. 3.

FIG. 3 is a view illustrating a process of modifying profile 1 in order to obtain a new SOC-OCV profile in a case where degradation caused by use of the secondary battery has progressed, and FIG. 4 is a graph illustrating a new SOC-OCV profile (profile 3) of the cathode of the secondary battery obtained by going through the modifying process of FIG. 3. Further, FIG. 5 is a graph illustrating a new SOC-OCV profile (profile 4) of the anode of the secondary battery obtained by migrating profile 2 horizontally in the case where degradation by use of the secondary battery has progressed.

Referring to FIG. 3 and FIG. 4, in the case where degradation by use of the secondary battery has progressed and thus the level of degradation is a (%), only the OCV value corresponding to each SOC of profile 1 of the cathode changes with the range of OCV maintained as it is.

The reason why the OCV range of the cathode does not change despite the degradation by use of the secondary battery as aforementioned is because the change of OCV of the cathode can be explained as not a structure collapse of the cathode active material but as a loss of reaction site. Due to this reason, despite the progression of degradation, the OCV range represented by the cathode does not change, and it is only the SOC value corresponding to a certain OCV that changes.

That is, assuming the SOC value and the OCV value are X and Y, respectively, in the case where degradation of the secondary battery has progressed by as much as a (%), function Y=F1(X) (note, 0≤X≤100) that forms profile 1 on an X-Y plane is migrated (migrated to a left side on the graph of FIG. 3) such that the SOC value, X, decreases by a ratio of (100−a)/100, and then migrated (migrated to a right side on the graph of FIG. 3) such that X increases again by as much as the level of degradation, a (%), with the OCV value, Y, maintained as it is.

Consequently, profile 1 represented in the form of Y=F1(X) (note, 0≤X≤100) is converted into profile 3 having the form of Y=F1(((100−a)/100)×X+a) (note, a≤X≤100) by reflecting the level of degradation, a (%).

These two times of migration of coordinates as aforementioned makes profile 1 to have the form of profile 3 where the SOC range is reduced as illustrated in FIG. 4, in which case the range of OCV does not change either as already explained hereinabove.

In fact, in the graphs illustrated in the drawings of the present application, the fresh cell where degradation has not progressed and a degraded cell where degradation had progressed by 20% both showed a same range of OCV range of about 3.37V to 4.28V in the entirety of the SOC section.

Next, referring to FIG. 5, in the case where degradation by use of the secondary battery has progressed and thus the level of degradation is a (%), profile 2 of the anode is migrated horizontally by as much as a (%) in X-axis direction while maintaining its original function shape (curved shape) as it is, whereby unlike the case of the cathode explained hereinabove, not only the range of SOC but also the range of OCV may change (however, in an actual case of graphite being used as the anode, there are many sections where the OCV-SOC graph is almost flat, meaning that there is almost no substantial change of OCV by migration of the graph).

The reason why the aspect of change of the SOC-OCV profile of the anode is different from that of the cathode in the case of degradation by use of the secondary battery is because the change of OCV of the anode can be explained as a reduction of reactable lithium (Li) ions by the degradation.

That is, when assuming the SOC value and the OCV value as X and Y, respectively, in the case where degradation in the secondary battery has progressed by as much as a (%), function Y=F2(X) (note, 0≤X≤100) forming profile 2 on the X-Y plane has a form where all the coordinates on the graph are migrated in X-axis direction by as much as a (%).

Consequently, profile 2 represented in the form of Y=F2(X) (note, 0≤X≤100) is converted into profile 4 in the form of Y=F2(X−a) (note, a≤X≤100) by reflecting the level of degradation of a (%).

Next, the step S3 will be explained more specifically with reference to FIG. 6.

Figure 5:
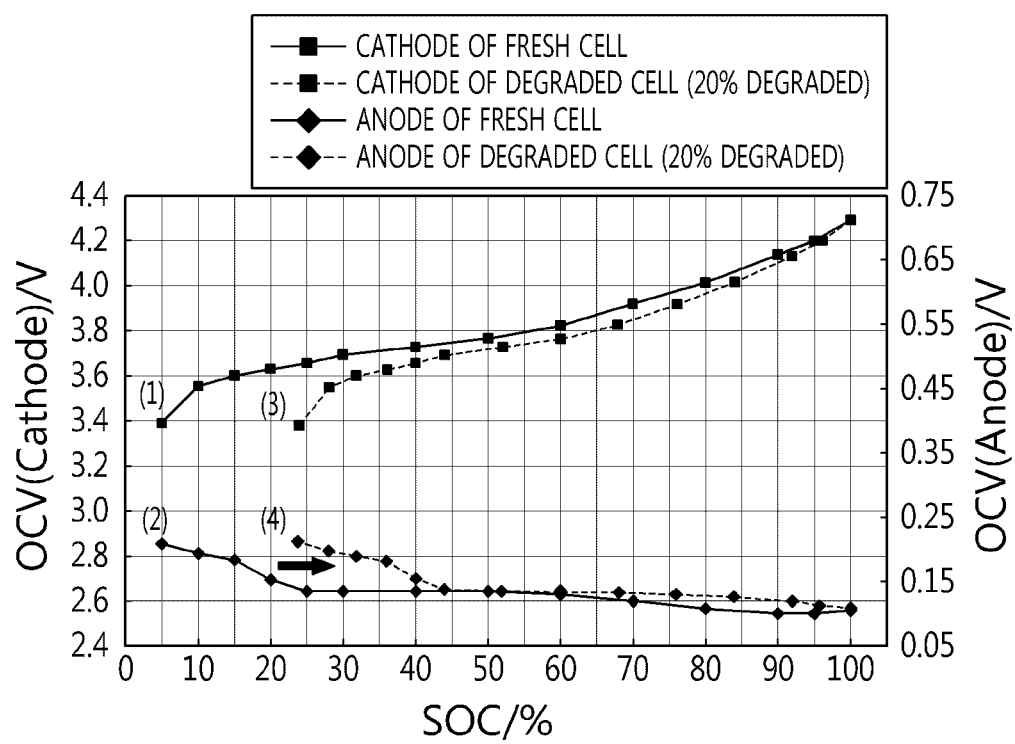
FIG. 5 is a graph illustrating a new SOC-OCV profile (profile 4) of the anode of the secondary battery obtained by migrating profile 2 horizontally in a case where degradation by use of the secondary battery has progressed.
Figure 6:
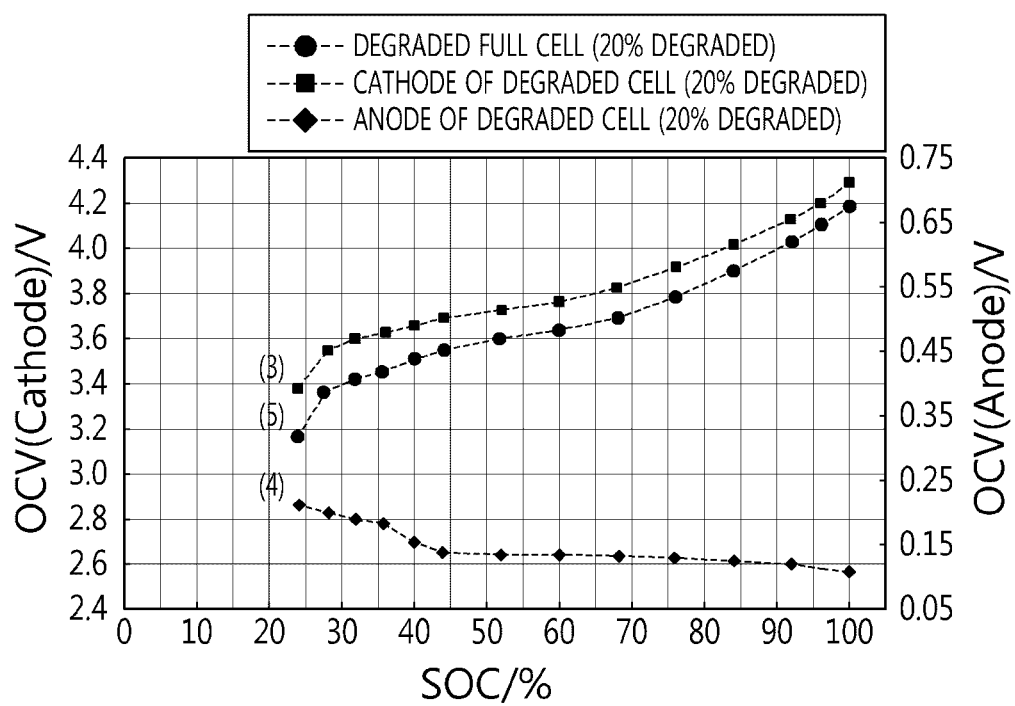
FIG. 6 is a graph illustrating a new SOC-OCV profile (profile 5) of the secondary battery (full cell) obtained using profile 3 and profile 4 illustrated in FIG. 4 and FIG. 5.

FIG. 6 is a graph illustrating a new SOC-OCV profile (profile 5) of the secondary battery (full cell) obtained using profile 3 and profile 4 illustrated in FIG. 4 and FIG. 5.

Referring to FIG. 6, the OCV value of the secondary battery where degradation has progressed, that is, a degraded full cell is equivalent to the difference between the OCV value of the cathode of the degraded cell and the OCV value of the anode of the degraded cell.

That is, the OCV value of the degraded full cell is calculated by a new function F3(X)=F1(((100−a)/100)×X+a)−F2(X−a) representing profile 5. That is because the OCV of the full cell is equivalent to the value obtained by subtracting the OCV of the anode of the half cell from the OCV of the cathode of the half cell.

That is, the SOC-OCV profile (profile 5) of the degraded secondary battery may be represented as Y=F1(((100−a)/100)×X+a)−F2(X−a) (note, a≤X≤100). Since the graphs illustrated in the drawings of the present disclosure were prepared on the basis of the level of degradation being 20%, the range of SOC is 20≤X≤100.

In the graphs illustrated in the drawings of the present disclosure, the range of SOC that a degraded cell represents is marked as 20% to 100%, but this means that due to the degradation of the secondary battery, the actual usable capacity has decreased compared to the fresh cell.

That is, the SOC 20% point and the SOC 100% point marked on the X-axis in the graphs illustrated in the drawings are the points corresponding to the SOC 0% and the SOC 100% of the degraded cell, respectively, whereby the degree of change of OCV by the change of SOC becomes greater compared to the profile of the fresh cell, meaning that in the case of a degraded cell, the SOC reduction by use compared to a fresh cell progresses quickly and therefore the usable time is reduced.

Figure 7:
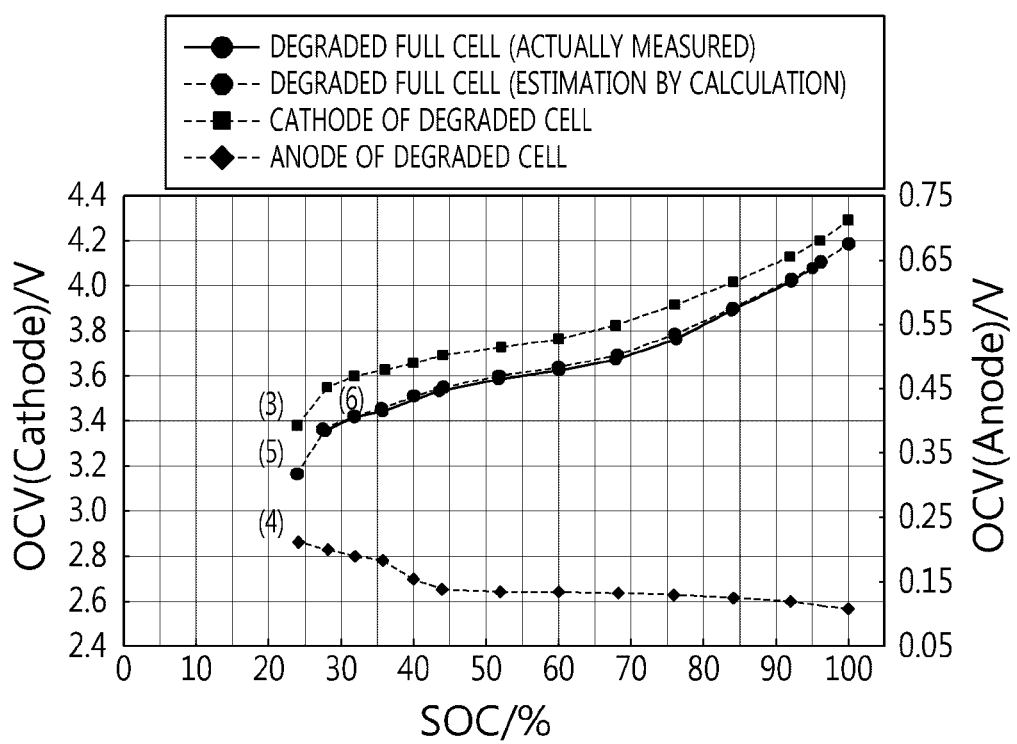
FIG. 7 is a graph illustrating proceedings of comparing the new profile 5 illustrated in FIG. 6 with an SOC-OCV profile obtained by actual measurement.

Meanwhile, when comparing profile 5 of the degraded cell calculated by going through the steps S1 to S3 with profile 6 of the degraded cell obtained by actual measurement, one can see that the two are almost the same as illustrated in FIG. 7, whereby one can see that the method for estimating an SOC-OCV profile by degradation of a secondary battery according to the present disclosure is very efficient.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

What is claimed is:

1. A method for estimating an SOC-OCV profile by degradation of a secondary battery of an electronic apparatus, the method comprising:
   individually obtaining a first SOC-OCV profile of a cathode of the secondary battery and a second SOC-OCV profile of an anode of the secondary battery by measuring an open circuit voltage (OCV) of the cathode and the anode caused by a change in ain each state of charge (SOC) using a half cell, wherein the half cell is a cell provided with only one of a cathode and the anode;

obtaining a third SOC-OCV profile of the cathode by reflecting a level of degradation by use of the secondary battery to modify the first SOC-OCV profile of the cathode, but setting only an SOC range to be narrow in proportion to the level of degradation while maintaining an OCV range of the cathode as it is;

obtaining a fourth SOC-OCV profile of the anode by migrating the second SOC-OCV profile of the anode in a horizontal direction taking into account the level of degradation by use of the secondary battery;

obtaining a fifth SOC-OCV profile of a full cell of the secondary battery by determining a subtraction of an OCV value by the SOC-OCV profile of the anode from an OCV value by the SOC-OCV profile of the cathode as an OCV value of the secondary battery;

providing information on a remaining usable amount of battery based on the fifth SOC-OCV profile to the electronic apparatus; and initiating charging and discharging of the secondary battery using the fifth SOC-OCV profile, wherein the cathode material comprises $Li_{1+x}Ni_aCo_bMn_cO_2$, $x \geq 0$; $a=b=c=\frac{1}{3}$, wherein the anode material comprises graphite, wherein the OCV range of the cathode in the first profile and in the third profile are the same being 3.37V to 4.28V regardless of the level of degradation, and wherein the OCV range of the anode in the second profile is represented as 0.10V to 0.23V.

2. The method of claim 1, wherein each of the first profile to the fifth profile is represented in a form of a function having an SOC value as an X value and the OCV value as a Y value.

3. The method of claim 2, wherein in the first profile and the second profile, range of the X (%) is $0 \leq X \leq 100$, and in the third profile and the fourth profile, range of the X (%) is $a \leq X \leq 100$, wherein a represents the level of degradation.

4. The method of claim 3, wherein when the first profile is Y=F1(X), the third profile is represented as Y=F1(((100−a)/100)×X+a), wherein Fx represents the $x^{th}$ profile.

5. The method of claim 4, wherein when the second profile is Y=F2(X), the fourth profile is represented as Y=F2(X−a).

6. The method of claim 5, wherein the fifth profile is Y=F1(((100−a)/100)×X+a)−F2(X−a)(note, $a \leq X \leq 100$).

* * * * *